United States Patent
Suzuki et al.

(10) Patent No.: US 8,638,172 B2
(45) Date of Patent: Jan. 28, 2014

(54) LOCAL OSCILLATOR

(75) Inventors: Yoshinori Suzuki, Tokyo (JP); Hiroyuki Kobayashi, Kanagawa-ken (JP); Jun Deguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 162 days.

(21) Appl. No.: 13/230,041

(22) Filed: Sep. 12, 2011

(65) Prior Publication Data

US 2012/0062289 A1 Mar. 15, 2012

(30) Foreign Application Priority Data

Sep. 13, 2010 (JP) ................................ 2010-204523

(51) Int. Cl.
*H03L 7/099* (2006.01)
(52) U.S. Cl.
USPC ............ 331/1 A; 331/1 R; 327/154; 327/156; 375/376
(58) Field of Classification Search
USPC ...... 331/1 A, 1 R, 2, 17, 25, 46, 49; 327/154, 327/147, 150, 156, 159; 375/376
See application file for complete search history.

(56) References Cited

U.S. PATENT DOCUMENTS

| | | | |
|---|---|---|---|
| 6,211,747 B1 * | 4/2001 | Trichet et al. | 332/128 |
| 7,760,042 B2 * | 7/2010 | Mayer et al. | 332/128 |
| 2009/0052508 A1 * | 2/2009 | Takahashi | 375/219 |
| 2012/0100821 A1 * | 4/2012 | Dan et al. | 455/269 |

FOREIGN PATENT DOCUMENTS

JP 2001-244810 9/2001

OTHER PUBLICATIONS

Staszewski, et al. All-Digital PLL with Ultra Fast Acquisition, ASSCC 2005, pp. 289-292.

* cited by examiner

*Primary Examiner* — Joseph Chang
*Assistant Examiner* — Jeffrey Shin
(74) *Attorney, Agent, or Firm* — White & Case LLP

(57) ABSTRACT

A local oscillator of an embodiment includes a digitally-controlled oscillator, a phase data generator, a subtractor, a loop filter, a multiplier, and a coefficient calculator. The digitally-controlled oscillator variably controls an oscillation frequency of an oscillation signal by using a first oscillator control value. The oscillation frequency is equal to a product of the first oscillator control value multiplied by an amount of change in the oscillation frequency per unit first oscillator control value. Set frequency data is calculated by dividing a set frequency by a reference frequency of a reference signal. The multiplier outputs the first oscillator control value obtained by multiplying a normalized control value from the loop filter by a first coefficient. The coefficient calculator divides, by the set frequency data, the first oscillator control value which makes the oscillation frequency roughly equal to the set frequency, and sets the quotient as a new first coefficient in the multiplier.

7 Claims, 9 Drawing Sheets

(a)

(b)

LOCAL OSCILLATOR

CROSS REFERENCE TO RELATED APPLICATIONS

This application is based upon and claims the benefit of priority from the prior Japanese Patent Application No. 2010-204523, filed on Sep. 13, 2010, the entire contents of which are incorporated herein by reference.

FIELD

Embodiments of the invention relate to a local oscillator.

BACKGROUND

In recent years, all digital phase locked loop (ADPLL) circuits, which are phase locked loop (PLL) circuits where all the control signals are digitalized, have been used as local oscillators in radio communication apparatuses and the like. The ADPLL circuits use digital circuits in place of analog circuits, and thus can save space and electric power consumption.

An ADPLL circuit includes a digital loop filter, a digitally-controlled oscillator (DCO), and a phase data generator (PDG). The digitally-controlled oscillator outputs an oscillation signal with an oscillation frequency corresponding to an oscillator control value. The phase data generator outputs a phase difference between a reference signal and the oscillation signal. The results obtained by subtracting the phase difference from set frequency data is filtered by the digital loop filter. The filtered signal is multiplied by a coefficient Kosc, and the product thus obtained is set as the oscillator control value.

The digitally-controlled oscillator is an analog circuit. Accordingly, the amount of change in the oscillation frequency per unit oscillator control value fluctuates depending on the process, source voltage, and temperature (PVT). When the amount of change in the oscillation frequency per unit oscillator control value fluctuates, the already-set coefficient Kosc is no longer optimal. Hence, the phase noise characteristics of the oscillation signal outputted by the local oscillator in the stable state (locked-up state) also fluctuate depending on the PVT. To put it differently, phase noise characteristics stable and independent of the PVT cannot be obtained.

To address this problem, the following technique is known. Firstly, the oscillator control value of the digitally-controlled oscillator is acquired with the ADPLL circuit made stable at a certain oscillation frequency. Then, the oscillator control value of the digitally-controlled oscillator is acquired with the ADPLL circuit made stable at a different oscillation frequency. After that, an accurate amount of change in the oscillation frequency per unit oscillator control value under the current conditions of the PVT is calculated from the difference between the two oscillation frequencies and the difference between the two oscillator control values. Thus, phase noise characteristics stable and independent of the PVT can be obtained by adjusting the coefficient Kosc appropriately on the basis of the value thus calculated.

This technique, however, requires a long time to adjust the coefficient Kosc because the ADPLL circuit is locked up twice.

DETAILED DESCRIPTION

Figure 1:
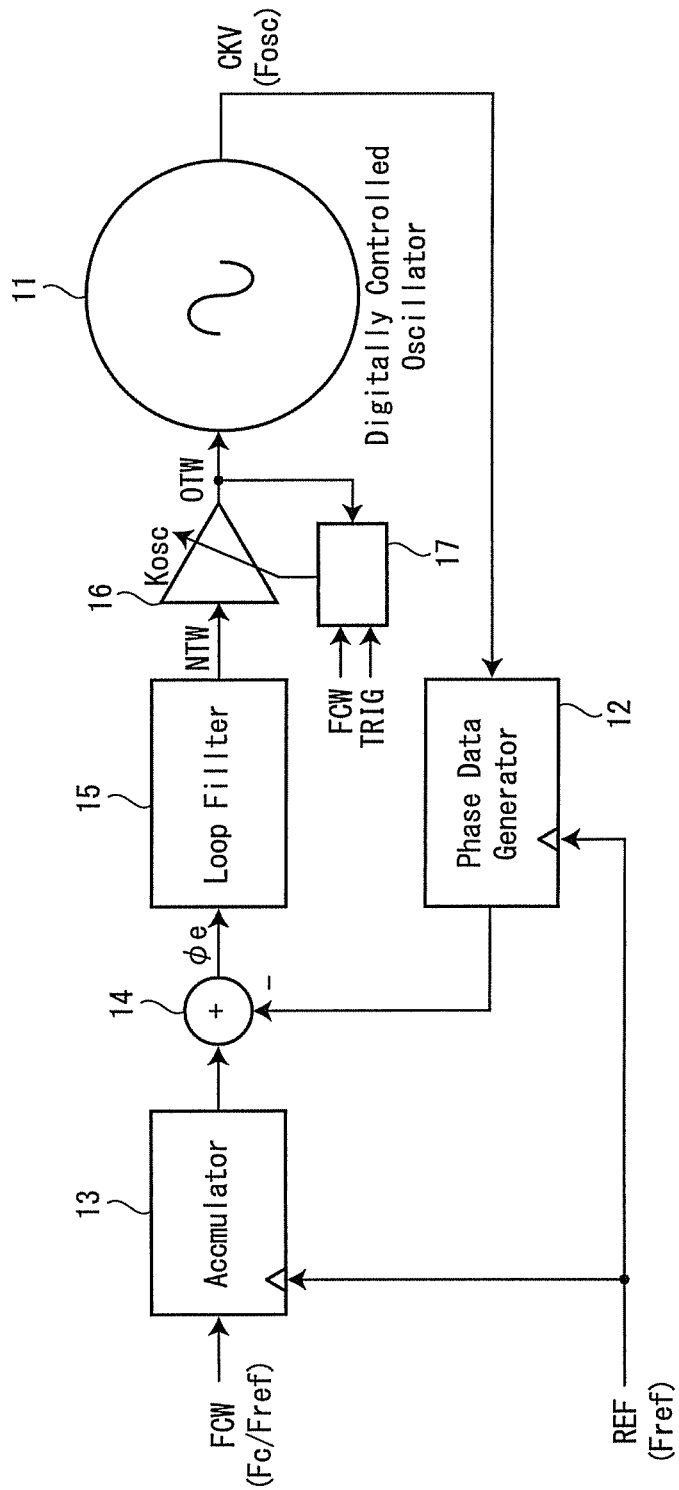
FIG. 1 shows a block diagram of a local oscillator according to a first embodiment.

Embodiments of the invention are described below by referring to the drawings. The embodiments are provided not for the purpose of limiting the invention.

First Embodiment

FIG. 1 shows a block diagram of a local oscillator according to a first embodiment of the invention.

As FIG. 1 shows, the local oscillator (ADPLL) includes a digitally-controlled oscillator 11, a phase data generator 12, an accumulator 13, a subtractor 14, a loop filter 15, a multiplier 16, and a coefficient calculator 17. All the constituent components other than the digitally-controlled oscillator 11 are digital circuits.

The digitally-controlled oscillator 11 is capable of discretely controlling an oscillation frequency Fosc of an oscillation signal CKV by using a first oscillator control value OTW (oscillator tuning word) that is a digital value. The oscillation frequency Fosc is equal to the product of the first oscillator control value OTW and the amount of change in the oscillation frequency Fosc per unit first oscillator control value OTW. The digitally-controlled oscillator 11 is a current-controlling-type oscillator, where the oscillation frequency Fosc is controlled by a current value.

The phase data generator 12 outputs a phase difference between a reference signal REF and the oscillation signal CKV as phase difference data of a digital value. The phase data generator 12 accumulates the phase difference data and outputs the accumulated phase difference data at each rising of the reference signal REF. For instance, if the initial oscillation frequency Fosc is 2440 MHz and a reference frequency Fref of the reference signal REF is 40 MHz, the initial phase difference data is 61 (=2440 MHz/40 MHz). Hence, the phase data generator 12 sequentially outputs 61, 122, 183 . . . as phase difference data for every 1/40 ms.

The accumulator 13 receives set frequency data FCW (frequency command word) and the reference signal REF. The set frequency data FCW is obtained by dividing a set frequency Fc by the reference frequency Fref of the reference signal REF. The accumulator 13 accumulates the set frequency data FCW (=Fc/Fref) and outputs the accumulated set frequency data FCW at every rising of the reference signal REF. For instance, if the set frequency Fc is 2400 MHz, the accumulator 13 sequentially outputs 60, 120, 180 . . . as the set frequency data FCW for every 1/40 ms.

The subtractor 14 subtracts the phase difference data, which is the output of the phase data generator 12, from the set frequency data FCW, which is the output of the accumulator 13. Then, the subtractor 14 outputs the subtraction result, that is, phase error data φe. In the above-described case, the subtractor 14 sequentially outputs −1, −2, −3 . . . as the phase error data φe for every 1/40 ms.

The loop filter 15 acts as a low-pass filter, and outputs a normalized control value NTW (normalized tuning word) obtained by filtering the phase error data φe.

The multiplier 16 outputs, to the digitally-controlled oscillator 11, the first oscillator control value OTW (oscillator tuning word), which is a product of the normalized control value NTW multiplied by the first coefficient Kosc. In the above-described case, if the first coefficient Kosc is the optimal value, the multiplier 16 outputs a first oscillator control value OTW that lowers the oscillation frequency Fosc of the digitally-controlled oscillator 11 by 40 MHz when the normalized control value NTW is −1.

Once the oscillation frequency Fosc becomes substantially equal to the set frequency Fc, the coefficient calculator 17 receives a trigger signal TRIG. Upon receiving the trigger signal TRIG, the coefficient calculator 17 divides, by the set frequency data FCW, the first oscillator control value OTW which makes the oscillation frequency Fosc substantially equal to the set frequency Fc. Then, the coefficient calculator 17 sets the quotient as a new first coefficient Kosc in the multiplier 16.

Figure 2:
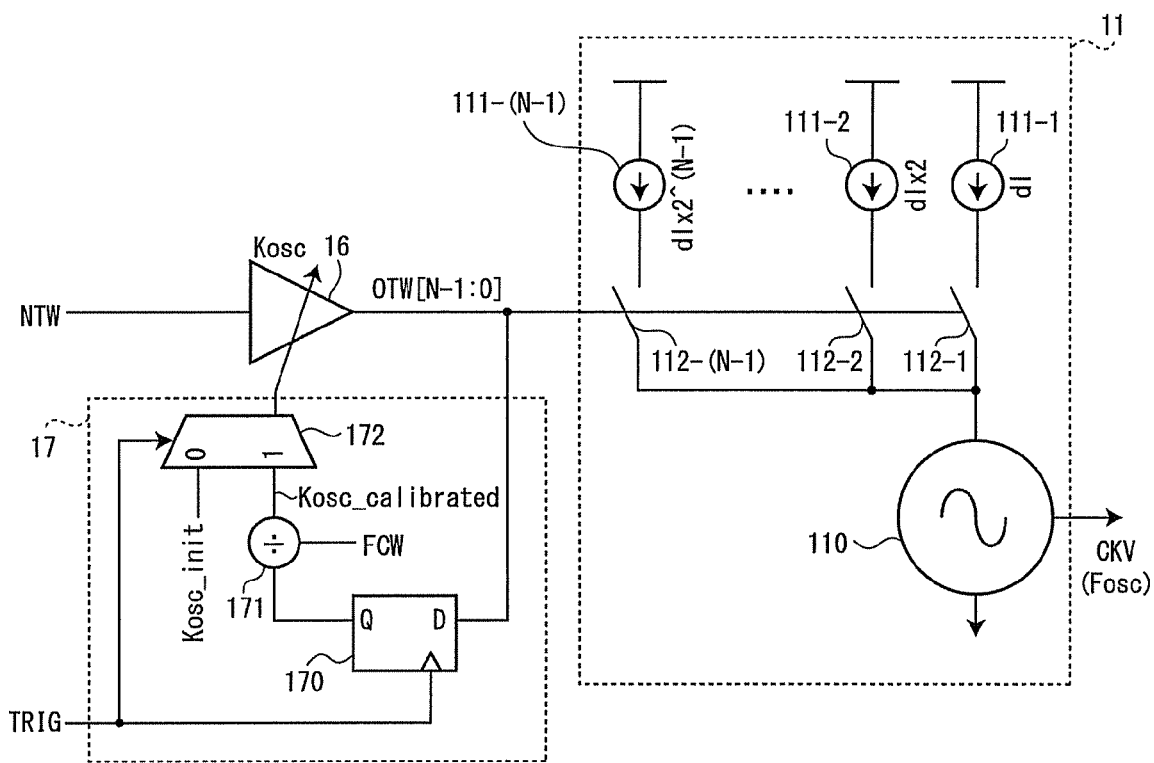
FIG. 2 shows a block diagram of a part of the local oscillator according to the first embodiment.

FIG. 2 shows a block diagram of a part of the local oscillator according to the first embodiment of the invention. FIG. 2 shows in detail the digitally-controlled oscillator 11, the multiplier 16, and the coefficient calculator 17 in the local oscillator shown in FIG. 1.

As FIG. 2 shows, the digitally-controlled oscillator 11 includes an oscillator 110, (N−1) units of current sources 111-1 to 111-(N−1), and (N−1) units of switches 112-1 to 112-(N−1). The current source 111-1 outputs an electric current dI, the current source 111-2 outputs an electric current dI×2, and the current source 111-(N−1) outputs an electric current $dI \times 2^{(N-1)}$. A first end of each of the current sources 111-1 to 111-(N−1) is connected to a power source, while a second end of each of the current sources 111-1 to 111-(N−1) is connected to an electric-current input terminal of the oscillator 110 via a corresponding one of the switches.

The switches 112-1 to 112-(N−1) are controlled to be turned ON or OFF in accordance with the first oscillator control value OTW [N−1:0]. In the case shown in FIG. 2, with a certain first oscillator control value OTW [N−1:0], at least one of the switches 112-1 to 112-(N−1) is turned ON.

The coefficient calculator 17 includes a flip flop 170, a divider 171, and a selector 172. The flip flop 170 fetches the first oscillator control value OTW [N−1:0] received through a data-input terminal D at the rising of the trigger signal TRIG received through a clock terminal, and outputs the fetched value through a data-output terminal Q to a first input terminal of the divider 171.

The divider 171 divides the first oscillator control value OTW [N−1:0] received through the first terminal by the set frequency data FCW received through a second input terminal, and outputs the quotient Kosc_calibrated to a first input terminal "1" of the selector 172.

If the trigger signal TRIG received through a control terminal is at the low level, the selector 172 sets the initial coefficient Kosc_init received trough a second input terminal "0" as a first coefficient Kosc in the multiplier 16. The initial coefficient Kosc_init is a predetermined value obtained by a simulation or the like. In contrast, if the trigger signal TRIG is at the high level, selector 172 sets the quotient Kosc_calibrated received through the first input terminal "1" as the first coefficient Kosc in the multiplier 16.

Figure 3:
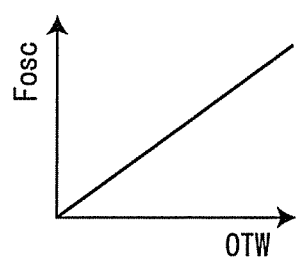
FIG. 3 shows charts describing operations of a digitally-controlled oscillator and a local oscillator according to the first embodiment.
Figure 3:
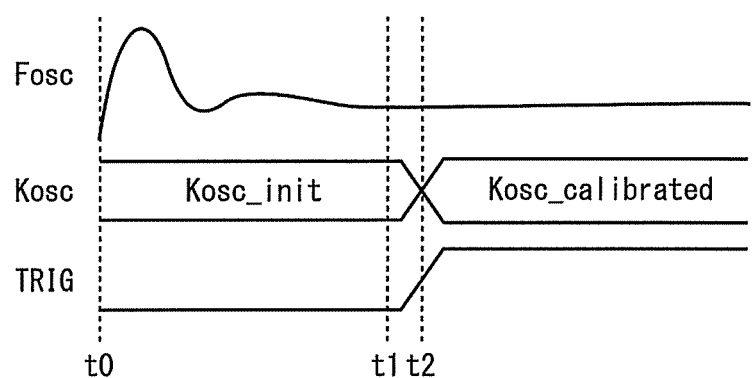

FIG. 3 shows charts describing operations of the digitally-controlled oscillator and the local oscillator according to the first embodiment of the invention.

Firstly, characteristics of the digitally-controlled oscillator 11 are described. As FIG. 3A shows, the oscillation frequency Fosc of the digitally-controlled oscillator 11 increases almost monotonically with the increase in the first oscillator control value OTW. This is because, as described earlier, the oscillation frequency Fosc is equal to the product of the first oscillator control value OTW and the amount of change in the oscillation frequency Fosc per unit first oscillator control value OTW. To put it differently, the relationship between the oscillation frequency Fosc and the first oscillator control value OTW is represented by a substantially straight line that passes on the origin of the axes.

Next, the operations of the local oscillator are described. As FIG. 3B shows, the local oscillator starts its operation at time t0. At that moment, the trigger signal TRIG is at the low level, and the multiplier 16 has the initial coefficient Kosc_init set as its first coefficient Kosc. The local oscillator adjusts the first oscillator control value OTW so as to make the oscillation frequency Fosc come closer to the set frequency Fc. Thus, at time t1, the oscillation frequency Fosc becomes substantially equal to the set frequency Fc. At that moment, the first coefficient Kosc is the initial coefficient Kosc_init. Hence, the first coefficient Kosc is unlikely to be optimal. Even if the first coefficient Kosc is not optimal, the local oscillator is locked up.

Then, the trigger signal TRIG rises to the high level, and at time t2, the first oscillator control value OTW at that moment is fetched by the flip flop 170. Then, the divider 171 divides the fetched first oscillator control value OTW by the set frequency data FCW. The quotient Kosc_calibrated is set as a new first coefficient Kosc in the multiplier 16.

In this way, an optimal first coefficient Kosc under the current conditions of the PVT can be obtained by locking up the local oscillator only once. Accordingly, optimal phase noise characteristics under the current conditions of the PVT can be obtained.

Description is given below of the principle that allows the optimal first coefficient Kosc to be obtained in the above-described way.

When the local oscillator is locked up, the following equation (1) holds true:

Oscillation frequency *Fosc*=Set frequency data FCW×
Reference frequency *Fref* (1)

In addition, the following equation (2) always holds true as well:

Oscillation frequency *Fosc*=OTW×"Amount of
change in the oscillation frequency *Fosc* per unit
first oscillator control value OTW" (2)

With the equations (1) and (2), the following equation (3) holds true:

"Amount of change in the oscillation frequency *Fosc*
per unit first oscillator control value OTW"=
(FCW×*Fref*)/OTW (3)

Note that the optimal first coefficient $Kosc_{opt}$ is a value that raises the oscillation frequency Fosc by an amount equivalent to the reference frequency Fref when the normalized control value NTW is +1. Hence, the following equation (4) holds true:

*Fref*="Amount of change in the oscillation frequency
*Fosc* per unit first oscillator control value
OTW"×1×$Kosc_{opt}$ (4)

With the equation (4), the following equation (5) holds true:

$Kosc_{opt} = Fref/$"Amount of change in the oscillation frequency Fosc per unit first oscillator control value OTW" (5)

With the equations (1) to (5), the following equation (6) is obtained:

$Kosc_{opt} = (Fref \times OTW)/(FCW \times Fref) = OTW/FCW$ (6)

Accordingly, as described earlier, the optimal first coefficient $Kosc_{opt}$ (=Kosc_calibrated) is obtained as the result of dividing the first oscillator control value OTW by the set frequency data FCW.

As has been described thus far, in this first embodiment, the first oscillator control value OTW which makes the oscillation frequency Fosc substantially equal to the set frequency Fc is divided by the set frequency data FCW, and the quotient Kosc_calibrated is set as a new first coefficient Kosc. Hence, the optimal first coefficient Kosc under the current conditions of PVT can be obtained by locking up the local oscillator once. If the conditions of the PVT change, the optimal first coefficient Kosc can be obtained through the above-described calculations with the local oscillator being locked up for another time. Thus, phase noise characteristics stable and independent of the PVT can be obtained in a short time.

Figure 4:
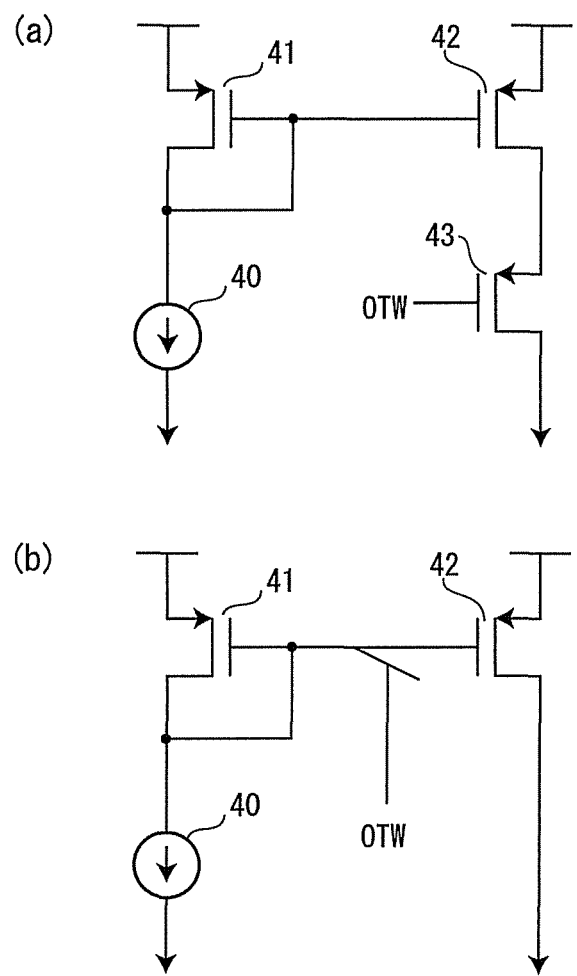
FIG. 4 shows circuit diagrams of a current source and a switch according to the first embodiment.

Note that each of the current sources 111-1 to 111-(N−1) shown in FIG. 2 and each of the switches 112-1 to 112-(N−1) shown in the same drawing can be configured, for instance, in a way shown in FIG. 4.

FIG. 4 shows circuit diagrams of the current source and the switch according to the first embodiment of the invention. FIG. 4A shows a current source and a switch that use three PMOS transistors 41, 42, and 43 together with a current source 40. In this configuration, the PMOS transistor 43 connected in series to the PMOS transistor 42, which forms a current mirror, is used as a switch. FIG. 4B shows a current source and a switch that use two PMOS transistors 41 and 42 together with the current source 40. In this configuration, the gate of the PMOS transistor 42, which forms a current mirror, is controlled by the switch.

Second Embodiment

This second embodiment differs from the first embodiment in the following point. The first coefficient is calculated on the basis of the oscillator control value obtained by roughly adjusting the oscillation frequency, and, on the basis of the first coefficient thus calculated, the oscillation frequency is finely adjusted.

Figure 5:
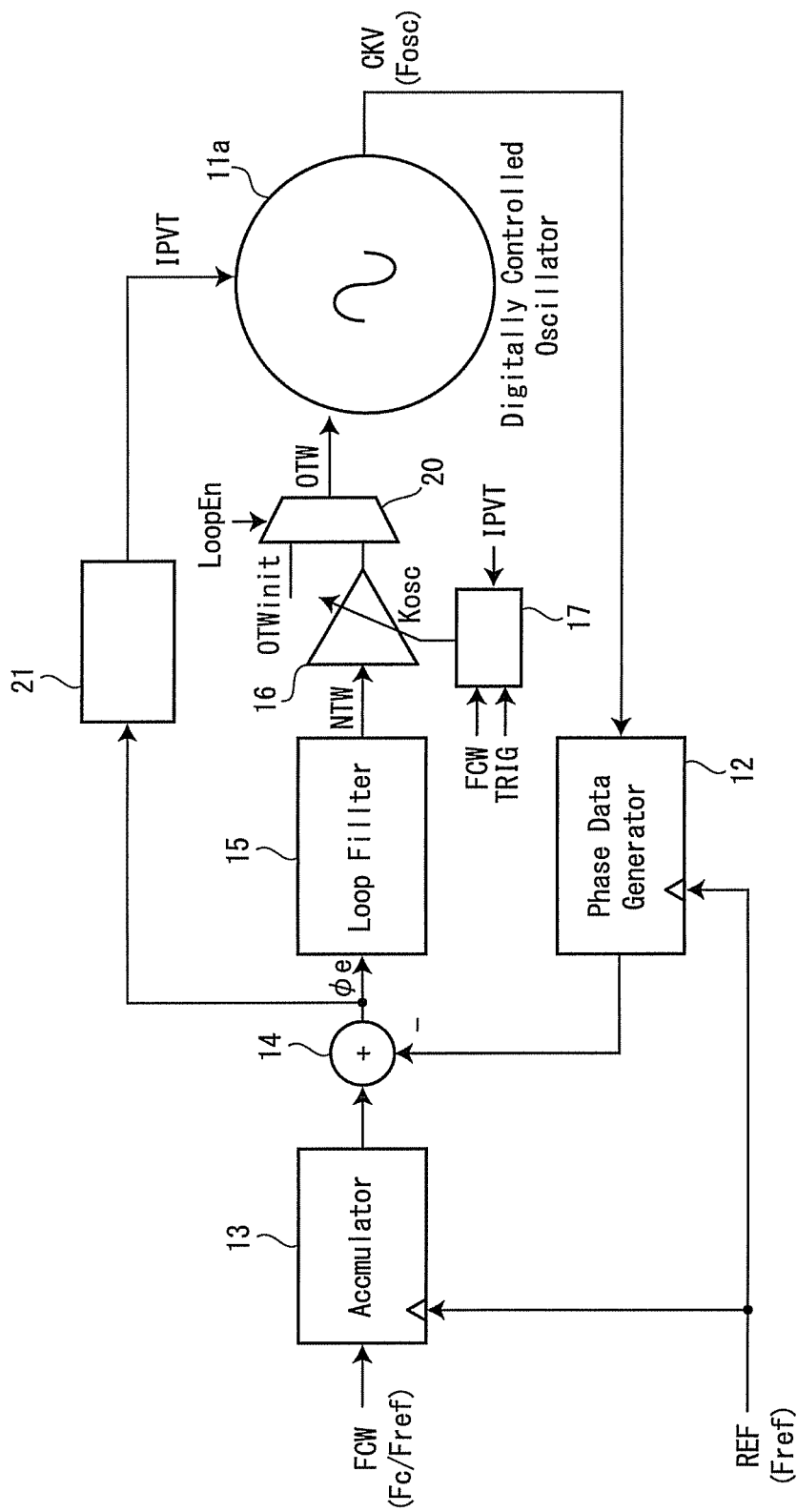
FIG. 5 shows a block diagram of a local oscillator according to a second embodiment.

FIG. 5 shows a block diagram of a local oscillator according to the second embodiment of the invention.

As FIG. 5 shows, the local oscillator of the second embodiment is a local oscillator including the same components as the first embodiment shown in FIG. 1, and further including a selector 20 and a rough adjustment controller 21. In addition, the local oscillator of the second embodiment includes a digitally-controlled oscillator 11a and a coefficient calculator 17a instead of the digitally-controlled oscillator 11 and the coefficient calculator 17 of the first embodiment. Other components of the circuit are the same as those in the first embodiment shown in FIG. 1. Accordingly, those components are denoted by the same reference numerals, and no description of these components will be provided.

The local oscillator is configured to roughly adjust the oscillation frequency Fosc of the oscillation signal CKV to a roughly adjusted frequency, and then finely adjust the roughly adjusted frequency to the set frequency Fc.

The digitally-controlled oscillator 11a is capable of controlling the oscillation frequency Fosc of the oscillation signal CKV by using the digital-value first oscillator control value OTW and a second oscillator control value IPVT. The amount of change in the oscillation frequency Fosc per unit second oscillator control value IPVT is equal to the amount of change in the oscillation frequency Fosc per unit first oscillator control value OTW multiplied by a second coefficient A. The oscillation frequency Fosc is obtained by adding the product of the first oscillator control value OTW multiplied by the amount of change in the oscillation frequency Fosc per unit first oscillator control value OTW to the product of the second oscillator control value IPVT multiplied by the amount of change in the oscillation frequency Fosc per unit second oscillator control value IPVT.

On the basis of the reference signal REF and the oscillation signal CKV, the rough adjustment controller 21 adjusts the second oscillator control value IPVT so as to make the phase error data $\phi e$ from the subtractor 14 smaller, and roughly adjusts the oscillation frequency Fosc to a roughly adjusted frequency.

At the time of the fine adjustment, the multiplier 16 outputs the first oscillator control value OTW obtained by multiplying the normalized control value NTW by the first coefficient Kosc to the digitally-controlled oscillator 11a via the selector 20.

Before the fine adjustment, the coefficient calculator 17a divides, by the set frequency data FCW, the product of the second oscillator control value IPVT used to roughly adjust the oscillation frequency Fosc to the roughly adjusted frequency multiplied by the second coefficient A. The coefficient calculator 17a sets the quotient as the first coefficient Kosc in the multiplier 16.

Figure 6:
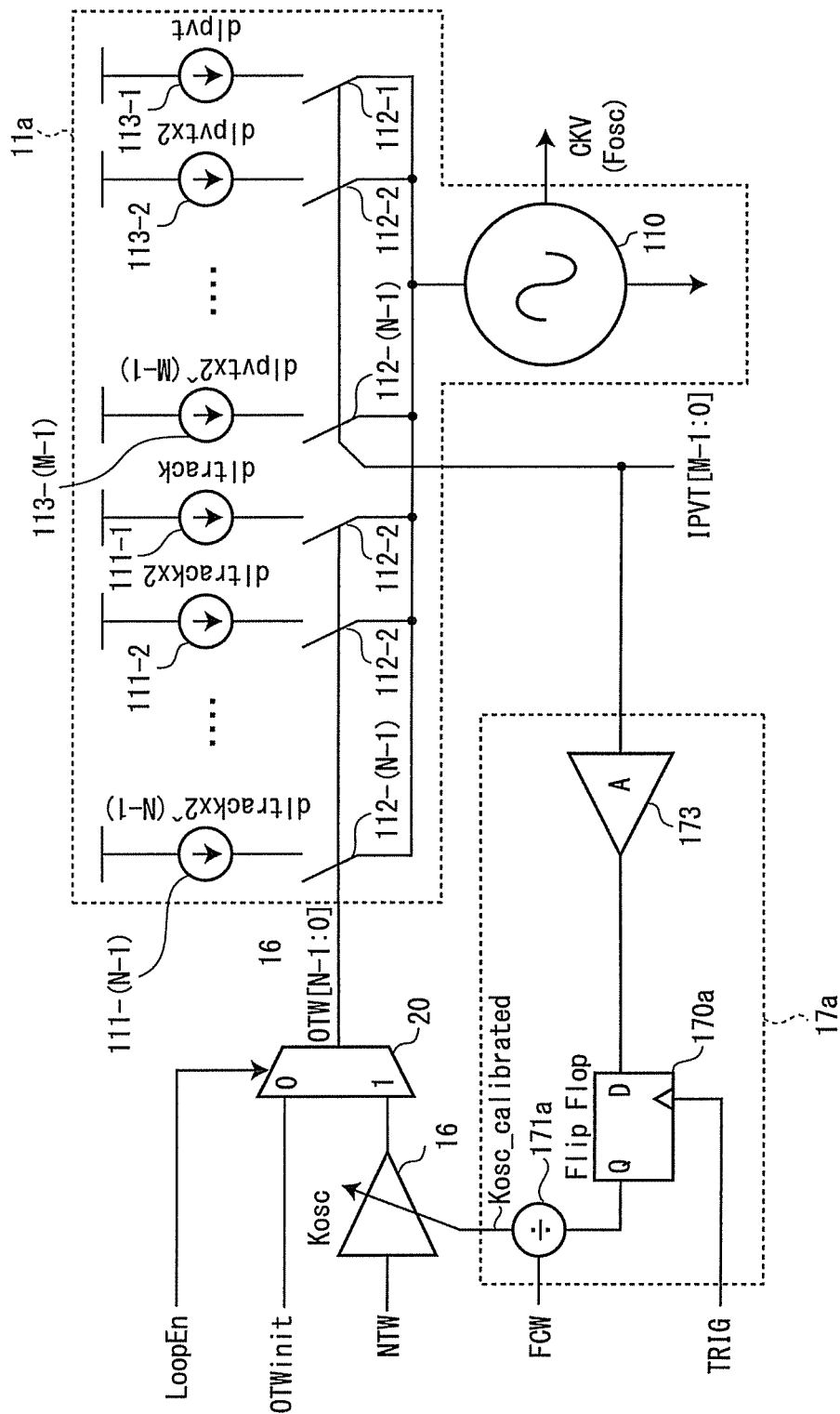
FIG. 6 shows a block diagram of a part of the local oscillator according to the second embodiment.

Next, the configuration of the local oscillator is described in more detail by referring to FIG. 6.

FIG. 6 shows a block diagram of a part of the local oscillator according to the second embodiment of the invention. FIG. 6 shows in detail the digitally-controlled oscillator 11a, the multiplier 16, the coefficient calculator 17a, and the selector 20 provided in the local oscillator shown in FIG. 5.

As FIG. 6 shows, the digitally-controlled oscillator 11a includes the oscillator 110, (N−1) units of current sources 111-1 to 111-(N−1) for fine adjustment, (N−1) units of switches 112-1 to 112-(N−1) for fine adjustment, (M−1) units of current sources 113-1 to 113-(M−1) for rough adjustment, and (M−1) units of switches 114-1 to 114-(M−1) for rough adjustment.

The current source 111-1 outputs an electric current dItrack, the current source 111-2 outputs an electric current dItrack×2, and the current source 111-(N−1) outputs an electric current dItrack×$2^{(N-1)}$. A first end of each of the current sources 111-1 to 111-(N−1) is connected to a power source, while a second end of each of the current sources 111-1 to 111-(N−1) is connected to an electric-current input terminal of the oscillator 110 via a corresponding one of the switches.

The switches 112-1 to 112-(N−1) are controlled to be turned ON or OFF in accordance with the first oscillator control value OTW [N−1:0]. In the case shown in FIG. 6, with a certain first oscillator control value OTW [N−1:0], at least one of the switches 112-1 to 112-(N−1) is turned ON.

The current source 113-1 outputs an electric current dIpvt, the current source 113-2 outputs an electric current dIpvt×2, and the current source 113-(M−1) outputs an electric current dIpvt×$2^{(M-1)}$. A first end of each of the current sources 113-1 to 113-(M−1) is connected to a power source, while a second end of each of the current sources 113-1 to 113-(M−1) is connected to an electric-current input terminal of the oscillator 110 via a corresponding one of the switches.

The switches 114-1 to 114-(M−1) are controlled to be turned ON or OFF in accordance with the second oscillator control value IPVT [M−1:0]. In the case shown in FIG. 6, with a certain second oscillator control value IPVT [M−1:0], at least one of the switches 114-1 to 114-(M−1) is turned ON.

The electric current dIpvt is equal to the electric current dItrack multiplied by a second coefficient A. Accordingly, as described earlier, the amount of change in the oscillation frequency Fosc per unit second oscillator control value IPVT is equal to the amount of change in the oscillation frequency Fosc per unit first oscillator control value OTW multiplied by the second coefficient A.

The coefficient calculator 17a includes a multiplier 173, a flip flop 170a, and a divider 171a.

The multiplier 173 multiplies the second oscillator control value IPVT [M−1:0] by the second coefficient A, and outputs the product.

The flip flop 170a fetches the second oscillator control value IPVT [M−1:0] multiplied by the second coefficient A received through a data-input terminal D at the rising of the trigger signal TRIG received through a clock terminal, and outputs the fetched value through a data-output terminal Q to a first input terminal of the divider 171a.

The divider 171a divides, by the set frequency data FCW received through a second input terminal, the second oscillator control value IPVT [M−1:0] multiplied by the second coefficient A received through the first input terminal, and sets the quotient Kosc_calibrated as a first coefficient Kosc in the multiplier 16.

The multiplier 16 outputs a value obtained by multiplying the normalized control value NTW by the first coefficient Kosc.

If a loop enable signal LoopEn received through a control terminal is at the low level, the selector 20 sets the initial set value OTWinit received through a second input terminal "0" as the first oscillator control value OTW [N−1:0] in the digitally-controlled oscillator 11a. The initial set value OTWinit is, for instance, a value to set one near the middle of the plural current values that the current sources 113-1 to 113-(M−1) are capable of setting. If the loop enable signal LoopEn is at the high level, the selector 172 sets, as the first oscillator control value OTW [N−1:0] Kosc in the digitally-controlled oscillator 11a, the value obtained by multiplying the normalized control value NTW by the first coefficient received through a first input terminal "1".

Figure 7:
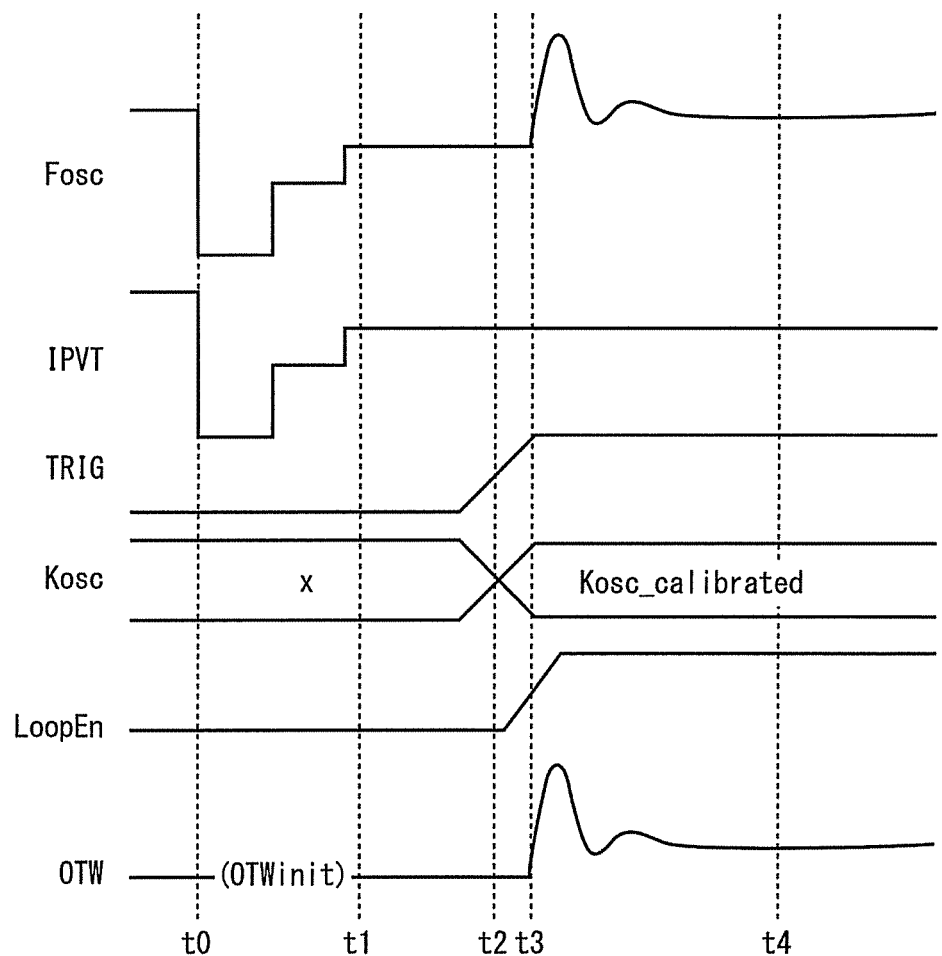
FIG. 7 shows a chart describing operations of a local oscillator according to a second embodiment.

FIG. 7 shows a chart describing operations of the local oscillator according to the second embodiment.

As FIG. 7 shows, the local oscillator starts the rough adjustment at time t0. At that moment, because the trigger signal TRIG is at the low level, the first coefficient Kosc of the multiplier 16 is indefinite. In addition, the loop enable signal LoopEn is also at the low level, so that the initial set value OTWinit is set as the first oscillator control value OTW [N−1:0] in the digitally-controlled oscillator 11a. Hence, a predetermined electric current is made to flow through the oscillator 110 by at least one of the current sources 111-1 to 111-(N−1). Accordingly, in the rough adjustment, no output value of the multiplier 16 is used to control the digitally-controlled oscillator 11a. To put it differently, the loop of the local oscillator via the loop filter 15 and the multiplier 16 is not used in the rough adjustment.

In the rough adjustment starting from time t0, the rough adjustment controller 21 adjusts the second oscillator control value IPVT on the basis of the phase error data φe from the subtractor 14, and roughly adjusts the oscillation frequency Fosc to a roughly adjusted frequency. Thus, at time t1, the oscillation frequency Fosc becomes substantially equal to the roughly adjusted frequency. Note that because the loop via the loop filter 15 and the multiplier 16 is not used in this process, the rough adjustment can be made quickly. The rough adjustment may be made, for instance, by the binary-tree method shown in FIG. 7, but any method can be employed for this purpose as long as the method can adjust the oscillation frequency Fosc to a roughly adjusted frequency that is close to the set frequency Fc.

When the rough adjustment is finished, the trigger signal TRIG rises to the high level. At time t2, flip flop 170a fetches a value obtained by the multiplication performed by the multiplier 173 so as to multiply the second oscillator control value IPVT at that moment by the second coefficient A. Then the divider 171a divides the fetched value by the set frequency data FCW. The quotient Kosc_calibrated is set as the first coefficient Kosc in the multiplier 16. The multiplier 16 outputs a value obtained by multiplying the normalized control value NTW by the first coefficient Kosc.

Then, the loop enable signal LoopEn rises to the high level. At time t3, the selector 20 sets, as the first oscillator control value OTW [N−1:0] in the digitally-controlled oscillator 11a, a value obtained by multiplying the normalized control value NTW by the first coefficient Kosc.

Thus, a loop via the loop filter 15 and the multiplier 16 is formed, and, on the basis of the optimal first coefficient Kosc, the oscillation frequency Fosc is finely adjusted so as to come closer to the set frequency Fc. Then, at time t4, the oscillation frequency Fosc becomes substantially equal to the set frequency Fc.

The principle that allows an optimal first coefficient Kosc to be obtained in the above-described manner is similar to the one in the first embodiment. Specifically, because dIpvt=A× dItrack, the equation dFpvt=A×dFtrack holds true. Note that in the equation, dFpvt represents the amount of change in the oscillation frequency Fosc per unit second oscillator control value IPVT, and dFtrack represents the amount of change in the oscillation frequency Fosc per unit first oscillator control value OTW.

In addition, FCW=Fosc/Fref. Thus, the following equation holds true.

$$Kosc_{opt} = Fref / dFtrack$$
$$= Fosc / (dFtrack \times FCW)$$
$$= (IPVT \times dFpvt) / (dFtrack \times FCW)$$
$$= A \times IPVT / FCW$$

As has been described thus far, in this second embodiment, before the fine adjustment, the product obtained by multiplying, by second coefficient A, the second oscillator control value IPVT used to roughly adjust the oscillation frequency Fosc to the roughly adjusted frequency is divided by the set frequency data FCW, and the quotient Kosc_calibrated is set as the first coefficient Kosc in the multiplier 16. Hence, the optimal first coefficient Kosc under the current conditions of the PVT can be obtained without using the loop filter 15. Accordingly, the optimal first coefficient Kosc can be obtained faster than in the first embodiment.

As in the case of the first embodiment, if the PVT changes, the optimal first coefficient Kosc can be obtained through the above-described calculations with the local oscillator being locked up for another time. Thus, phase noise characteristics stable and independent of the PVT can be obtained in a short time.

In addition, the amount of change in the oscillation frequency Fosc per unit first oscillator control value OTW for the fine adjustment is preferably small from the view point of, for instance, the phase noise characteristics and the accuracy of the oscillation frequency Fosc. In this second embodiment, if the amount of change in the oscillation frequency Fosc per unit first oscillator control value OTW is set to be the same as in the case of the first embodiment, the number of the current sources 111-1 to 111-(N–1) for fine adjustment and the number of the switches 112-1 to 112-(N–1) for fine adjustment can be reduced from the case of the first embodiment for the following reason. In this second embodiment, the rough adjustment is performed to adjust the oscillation frequency Fosc to the roughly adjusted frequency that is close to the set frequency Fc. Hence, the frequency range where the oscillation frequency Fosc is changed in the fine adjustment can be made narrower than the corresponding range in the first embodiment. Consequently, according to the second embodiment, the area of the digitally-controlled oscillator 11a (i.e., of the local oscillator) can be reduced from the corresponding area in the first embodiment. In addition, with the smaller area, the amount of change in the oscillation frequency Fosc per unit first oscillator control value OTW can be reduced.

Third Embodiment

This third embodiment differs from the second embodiment in that the first coefficient Kosc is calculated by taking account of the initial control value OTWinit as well.

Figure 8:
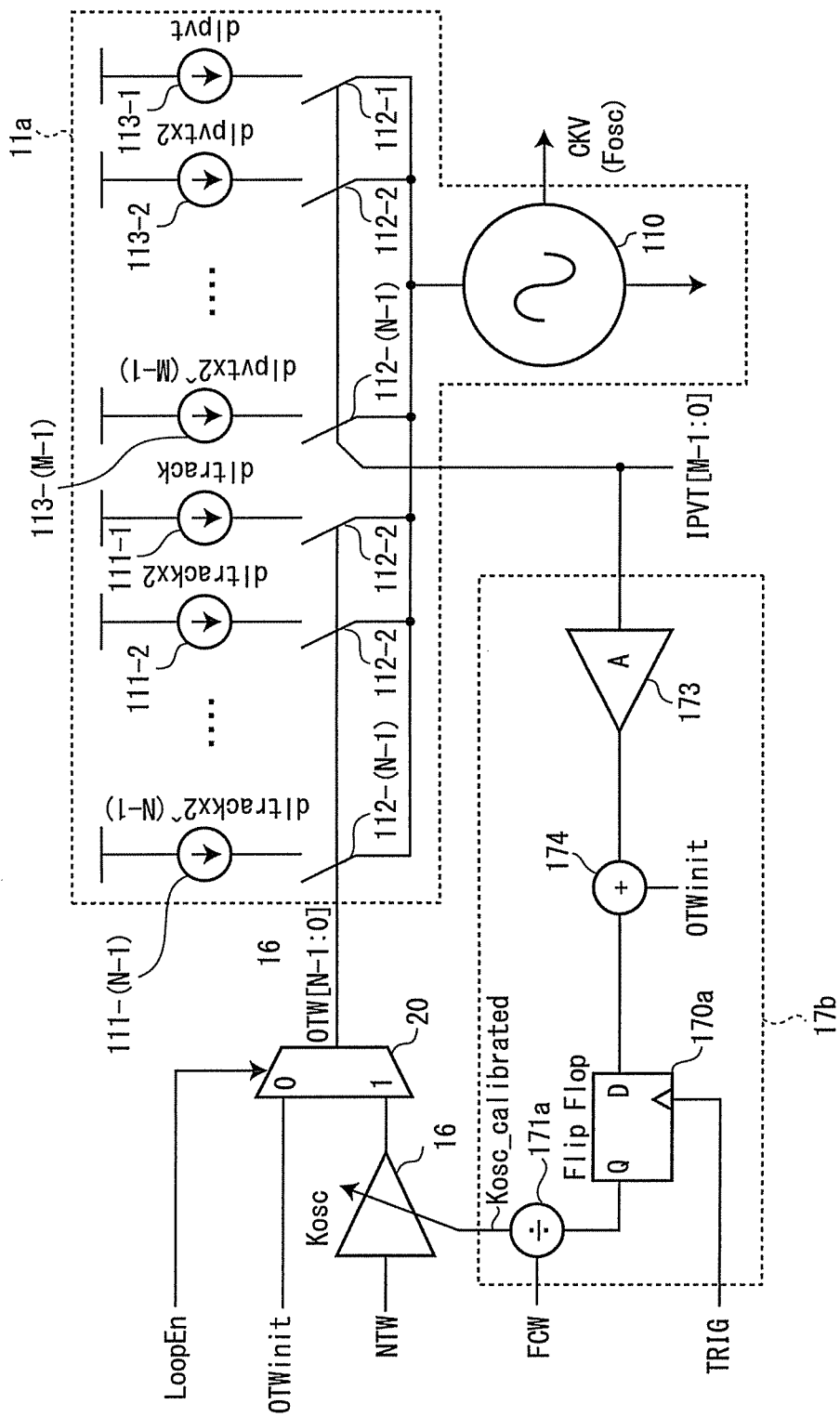
FIG. 8 shows a block diagram of a part of a local oscillator according to a third embodiment.

FIG. 8 shows a block diagram of a part of a local oscillator according to the third embodiment of the invention. FIG. 8 shows in detail the digitally-controlled oscillator 11a, the multiplier 16, a coefficient calculator 17b, and the selector 20.

As FIG. 8 shows, the coefficient calculator 17b further includes an adder 174 in addition to the configuration of the coefficient calculator 17a in the second embodiment. Other components of the circuit are the same as those in the second embodiment shown in FIG. 5. Accordingly, those components are denoted by the same reference numerals, and no description of these components will be provided.

The adder 174 adds the output value of the multiplier 173 and the initial control value OTWinit, and outputs the addition result to the flip flop 170a. As described in the second embodiment, the initial control value OTWinit is a value set as the first oscillator control value OTW in the rough adjustment.

Hence, before the fine adjustment, the coefficient calculator 17b adds the initial control value OTWinit to the product obtained by multiplying, by the second coefficient A, the second oscillator control value IPVT used to roughly adjust the oscillation frequency Fosc to the roughly adjusted frequency. The coefficient calculator 17b divides the addition result by the set frequency data FCW, and sets the quotient Kosc_calibrated as the first coefficient Kosc in the multiplier 16.

The principle that allows the optimal first coefficient Kosc to be obtained in the above-described manner is similar to the one in the second embodiment.

Thus, the following equation holds true.

$$Kosc_{opt} = Fref / dFtrack$$
$$= Fosc / (dFtrack \times FCW)$$
$$= (IPVT \times dFpvt + OTWinit \times dFtrack) / (dFtrack \times FCW)$$
$$= (A \times IPVT + OTWinit) / FCW$$

As has been described thus far, according to the third embodiment, the initial control value OTWinit that is set as the first oscillator control value OTW in the rough adjustment is taken into account when the first coefficient Kosc is calculated. Accordingly, a first coefficient Kosc that is more accurate than in the case of the second embodiment can be obtained.

In addition, the third embodiment can have similar effects to those obtained by the second embodiment.

Fourth Embodiment

This fourth embodiment differs from the third embodiment in that an initial value of the loop filter is set.

Figure 9:
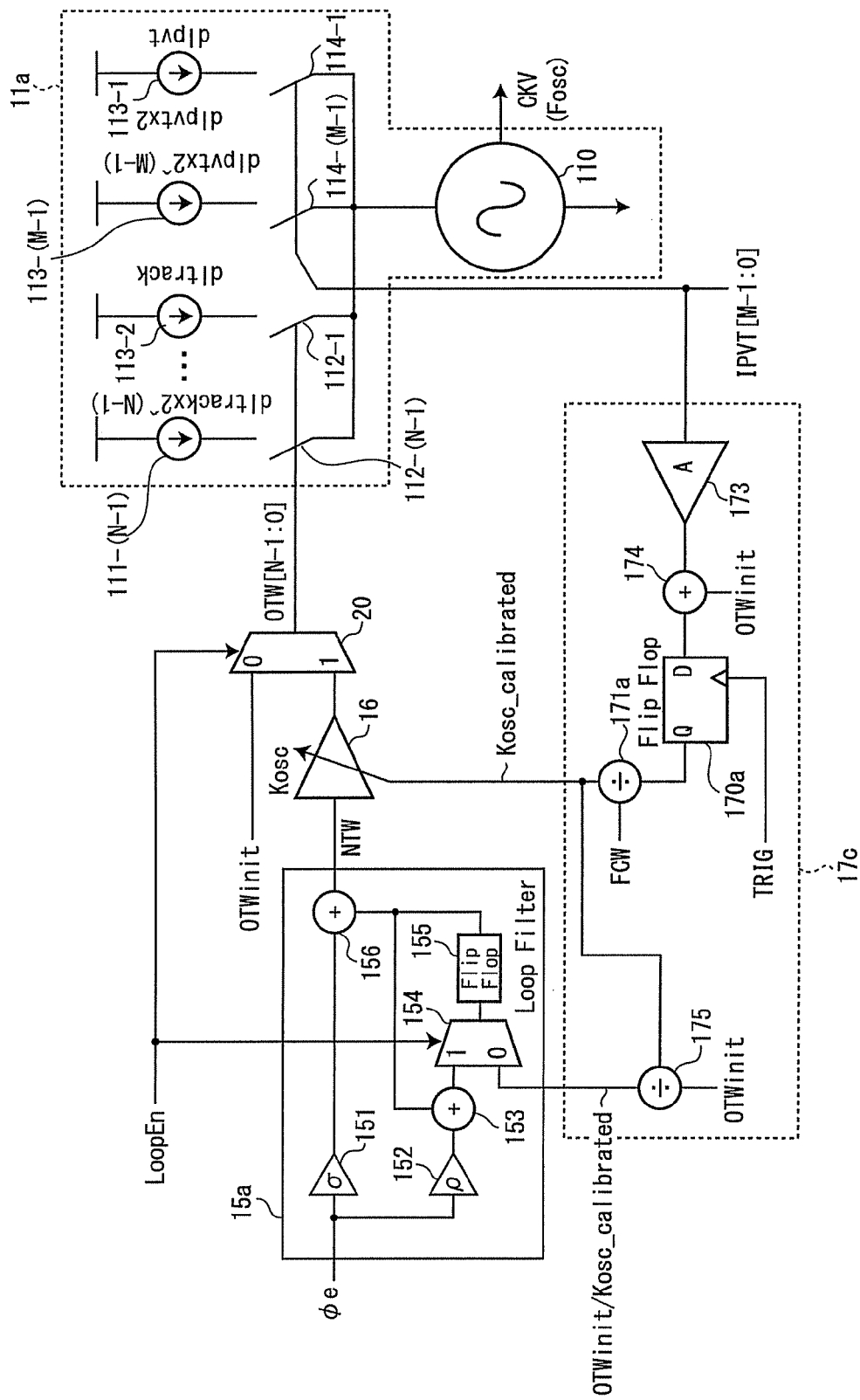
FIG. 9 shows a block diagram of a part of a local oscillator according to a fourth embodiment.

FIG. 9 shows a block diagram of a part of a local oscillator according to the fourth embodiment of the invention. FIG. 9 shows in detail the digitally-controlled oscillator 11a, a loop filter 15a, the multiplier 16, a coefficient calculator 17c, and the selector 20.

The coefficient calculator 17c further includes a divider 175 in addition to the configuration of the coefficient calculator 17b in the third embodiment. The divider 175 divides the initial control value OTWinit by the quotient Kosc_calibrated of the divider 171a, and outputs the quotient to the loop filter 15a.

The loop filter 15a includes a multiplier 151, a multiplier 152, an adder 153, a selector 154, a flip flop 155, and an adder 156.

The multiplier 151 multiplies the phase difference data φe inputted into the loop filter 15a by a constant α, and outputs the product to a first input terminal of the adder 156.

The multiplier 152 multiplies the phase difference data φe by a constant ρ, and outputs the product to a first input terminal of the adder 153.

The adder 153 adds the product from the multiplier 152 to the signal from the flip flop 155, and outputs the addition result to a first input terminal "1" of the selector 154.

The output signal of the selector 154 is inputted into the flip flop 155. The output signal of the flip flop 155 is inputted into a second input terminal of the adder 153 and into a second input terminal of the adder 156.

The adder 156 adds the product from the multiplier 151 to the output signal of the flip flop 155, and outputs the addition result as the normalized control value NTW.

A second input terminal "0" of the selector 154 receives a value "initial control value OTWinit/quotient Kosc_calibrated" from the coefficient calculator 17c.

A control terminal of the selector 154 receives the loop enable signal LoopEn.

Other components of the circuit are the same as those in the third embodiment shown in FIG. 8. Accordingly, those components are denoted by the same reference numerals, and no description of these components will be provided.

With the above-described configuration, if the loop enable signal LoopEn is at the low level, the value "initial control value OTWinit/quotient Kosc_calibrated" inputted into the selector 154 is inputted into the adder 156 via the flip flop 155. Thus, the value "OTWinit/Kosc_calibrated+αφe" is outputted as the initial value of the normalized control value NTW. Note that the value αφe is sufficiently small in comparison to the value "OTWinit/Kosc_calibrated." Accordingly, in the following description, the initial value of the normalized control value NTW is assumed to be "OTWinit/Kosc_calibrated."

In addition, if the loop enable signal LoopEn is at the high level, the loop filter 15a performs a process to pass low-frequency signals on the phase difference data φe, and thus generates the normalized control value NTW as in the case of the first embodiment. In this series of processes, the feedback circuit including both the adder 153 and the flip flop 155 functions as an integrator. The series of operations described above are similar to those of any known loop filter, so that no detail description of the operations will be provided.

If the quotient Kosc_calibrated is determined as the first coefficient Kosc at time t2 shown in FIG. 7, the loop filter 15*a* outputs a value "OTWinit/Kosc_calibrated" as the initial value of the normalized control value NTW. Accordingly, the multiplier 16 outputs the product of the value "OTWinit/Kosc_calibrated" multiplied by the quotient Kosc_calibrated, that is, outputs the initial control value OTWinit.

In this state, if the loop enable signal LoopEn comes to be at the high level at time t3 shown in FIG. 7, the selector 20 outputs, as the first oscillator control value OTW, the initial control value OTWinit, which is the output of the multiplier 16. Hence, the first oscillator control value OTW is not changed when the rough adjustment is switched to the fine adjustment, so that the fluctuation of the oscillation frequency Fosc is almost eliminated. Since the loop enable signal LoopEn is at the high level, the loop filter 15*a* outputs, as in the normal state, the normalized control value NTW obtained by filtering the phase error data φe. Thus, the oscillation frequency Fosc is controlled to come closer to the set frequency Fc as in the case of the third embodiment.

Accordingly, before the fine adjustment, the coefficient calculator 17*c* divides the initial control value OTWinit by the first coefficient Kosc calculated after the oscillation frequency Fosc is roughly adjusted to the roughly adjusted frequency. The coefficient calculator 17*c* then sets the quotient as the initial value of the normalized control value NTW in the loop filter 15*a*.

When the fine adjustment starts, the loop filter 15*a* outputs the initial value thus set as the normalized control value NTW.

In contrast to this fourth embodiment, according to the above-described third embodiment, the initial value of the normalized control value NTW of the loop filter 15 at the time when the rough adjustment is switched to the fine adjustment is a value stored in the register included in the loop filter 15. Hence, when the rough adjustment is switched to the fine adjustment, the first oscillator control value OTW may possibly change a great deal. To put it differently, the oscillation frequency Fosc may possibly fluctuate in that period.

As has been described thus far, according to the fourth embodiment, before the fine adjustment, the initial control value OTWinit is divided by the first coefficient Kosc calculated after the oscillation frequency Fosc is roughly adjusted to the roughly adjusted frequency. The quotient is set as the initial value of the normalized control value NTW in the loop filter 15*a*. Hence, the rough adjustment is switched to the fine adjustment, the first oscillator control value OTW does not change. Accordingly, the oscillation frequency Fosc fluctuates little. Consequently, the local oscillator can be locked up faster than in the case of the third embodiment.

In addition, the fourth embodiment can have similar effects that are obtainable by the third embodiment.

According to the embodiments described thus far, phase noise characteristics stable and independent of the PVT can be obtained in a short time.

Some embodiments of the invention have been described in detail thus far. Specific configurations of the embodiments described above are not the only possible ones. Rather, the invention can be carried out by making various modifications without departing from the scope of the invention.

For instance, the local oscillators of the above-described embodiments are applicable to any oscillation frequency Fosc.

In addition, the adder 174 may be eliminated from the fourth embodiment.

The invention claimed is:

1. A local oscillator comprising:
a digitally-controlled oscillator configured to output an oscillation signal with a predetermined oscillation frequency and to control variably the oscillation frequency by using a first oscillator control value and a second oscillator control value that are digital values, an amount of change in the oscillation frequency per unit second oscillator control value being equal to a product of an amount of change in the oscillation frequency per unit first oscillator control value multiplied by a second coefficient, the oscillation frequency being equal to a sum of a product of the first oscillator control value multiplied by the amount of change in the oscillation frequency per unit first oscillator control value, and a product of the second oscillator control value multiplied by the amount of change in the oscillation frequency per unit second oscillator control value;
a rough adjustment controller configured to roughly adjust the oscillation frequency to a roughly adjusted frequency by adjusting the second oscillator control value on the basis of a reference signal and the oscillation signal;
a phase data generator configured to output, as phase difference data of a digital value, a phase difference between the reference signal and the oscillation signal;
a subtractor configured to subtract the phase difference data from the set frequency data obtained by dividing a set frequency by a reference frequency of the reference signal, and to output the subtraction result as phase error data;
a loop filter configured to output a normalized control value obtained by filtering the phase error data;
a multiplier configured to multiply the normalized control value by a first coefficient to obtain the first oscillator control value and output the first oscillator control value to the digitally-controlled oscillator in fine adjustment; and
a coefficient calculator configured to set a value as the first coefficient in the multiplier before the fine adjustment, the value being calculated on the basis of the second oscillator control value used to roughly adjust the oscillation frequency to the roughly adjusted frequency, the second coefficient, and the set frequency data.

2. The local oscillator according to claim 1 wherein, before the fine adjustment, the coefficient calculator divides, by the set frequency data, a product of the second oscillator control value used to roughly adjust the oscillation frequency to the roughly adjusted frequency multiplied by the second coefficient, and sets the quotient as the first coefficient in the multiplier.

3. The local oscillator according to claim 2 wherein
before the fine adjustment, the coefficient calculator divides an initial control value by the first coefficient calculated after the oscillation frequency is roughly adjusted to the roughly adjusted frequency, and sets the quotient as an initial value of the normalized control value in the loop filter, and
the loop filter outputs the set initial value as the normalized control value when the fine adjustment starts.

4. The local oscillator according to claim 3 wherein the digitally-controlled oscillator controls the oscillation frequency by using a current value.

5. The local oscillator according to claim 1 wherein
in the rough adjustment, the first oscillator control value is set at an initial control value, and before the fine adjustment, the coefficient calculator adds the initial control value to a product of the second oscillator control value used to roughly adjust the oscillation frequency to the roughly adjusted frequency multiplied by the second coefficient, divides the addition result by the set frequency data, and sets the quotient as the first coefficient in the multiplier.

6. The local oscillator according to claim 5 wherein before the fine adjustment, the coefficient calculator divides the initial control value by the first coefficient calculated after the oscillation frequency is roughly adjusted to the roughly adjusted frequency, and sets the quotient as an initial value of the normalized control value in the loop filter, and the loop filter outputs the set initial value as the normalized control value when the fine adjustment starts.

7. The local oscillator according to claim 6 wherein, the digitally-controlled oscillator controls the oscillation frequency by using a current value.

* * * * *